(12) United States Patent
Cook et al.

(10) Patent No.: US 12,176,298 B2
(45) Date of Patent: Dec. 24, 2024

(54) FLOATING DIE PACKAGE

(71) Applicant: Texas Instruments Incorporated, Dallas, TX (US)

(72) Inventors: Benjamin Stassen Cook, Rockwall, TX (US); Steven Kummerl, Carrollton, TX (US); Kurt Peter Wachtler, Richardson, TX (US)

(73) Assignee: TEXAS INSTRUMENTS INCORPORATED, Dallas, TX (US)

( * ) Notice: Subject to any disclaimer, the term of this patent is extended or adjusted under 35 U.S.C. 154(b) by 155 days.

(21) Appl. No.: 17/115,734

(22) Filed: Dec. 8, 2020

(65) Prior Publication Data

US 2021/0091012 A1    Mar. 25, 2021

Related U.S. Application Data

(63) Continuation of application No. 15/248,151, filed on Aug. 26, 2016, now Pat. No. 10,861,796.
(Continued)

(51) Int. Cl.
*H01L 23/31* (2006.01)
*H01L 21/48* (2006.01)
(Continued)

(52) U.S. Cl.
CPC ........ *H01L 23/562* (2013.01); *H01L 21/4825* (2013.01); *H01L 21/56* (2013.01); *H01L 21/565* (2013.01); *H01L 21/78* (2013.01); *H01L 23/3114* (2013.01); *H01L 23/315* (2013.01); *H01L 23/49513* (2013.01); *H01L 23/4952* (2013.01); *H01L 23/49541* (2013.01); *H01L 23/49575* (2013.01); *H01L 24/48* (2013.01); *H01L 24/45* (2013.01); *H01L 24/85* (2013.01); *H01L 2224/32145* (2013.01); *H01L 2224/32245* (2013.01); *H01L 2224/45014* (2013.01);
(Continued)

(58) Field of Classification Search
None
See application file for complete search history.

(56) References Cited

U.S. PATENT DOCUMENTS

| 2,182,913 A | 12/1939 | Brubaker |
| 3,508,126 A | 4/1970 | Newman |

(Continued)

FOREIGN PATENT DOCUMENTS

| EP | 1986297 | 10/2008 |
| EP | 2490263 | 8/2012 |

(Continued)

OTHER PUBLICATIONS

Office Action for European Patent Application No. 17796774.2, mailed Jul. 9, 2020, 8 pgs.
(Continued)

*Primary Examiner* — Nishath Yasmeen
(74) *Attorney, Agent, or Firm* — Frank D. Cimino (57) ABSTRACT

A floating die package including a cavity formed through sublimation of a sacrificial die encapsulant and sublimation or separation of die attach materials after molding assembly. A pinhole vent in the molding structure is provided as a sublimation path to allow gases to escape, whereby the die or die stack is released from the substrate and suspended in the cavity by the bond wires only.

27 Claims, 5 Drawing Sheets

Related U.S. Application Data (60) Provisional application No. 62/334,133, filed on May 10, 2016.

(51) Int. Cl.

| | |
|---|---|
| *H01L 21/56* | (2006.01) |
| *H01L 21/78* | (2006.01) |
| *H01L 23/00* | (2006.01) |
| *H01L 23/495* | (2006.01) |

(52) U.S. Cl.
CPC .............. *H01L 2224/45015* (2013.01); *H01L 2224/45124* (2013.01); *H01L 2224/45144* (2013.01); *H01L 2224/45147* (2013.01); *H01L 2224/45565* (2013.01); *H01L 2224/45664* (2013.01); *H01L 2224/48091* (2013.01); *H01L 2224/48227* (2013.01); *H01L 2224/48245* (2013.01); *H01L 2224/48247* (2013.01); *H01L 2224/73265* (2013.01); *H01L 2224/85203* (2013.01); *H01L 2224/85205* (2013.01); *H01L 2224/85207* (2013.01); *H01L 2224/8592* (2013.01); *H01L 2224/9205* (2013.01); *H01L 2224/98* (2013.01); *H01L 2924/00014* (2013.01); *H01L 2924/18165* (2013.01)

(56) References Cited

U.S. PATENT DOCUMENTS

| | | | |
|---|---|---|---|
| 3,952,265 A | 4/1976 | Hunsperger | |
| 4,007,978 A | 2/1977 | Holton | |
| 4,210,923 A | 7/1980 | North et al. | |
| 4,267,484 A | 5/1981 | O'Loughlin | |
| 4,272,753 A | 6/1981 | Nicolay | |
| 4,303,934 A | 12/1981 | Stitt | |
| 4,757,210 A | 7/1988 | Bharat et al. | |
| 4,891,730 A | 1/1990 | Saddow et al. | |
| 4,916,506 A | 4/1990 | Gagnon | |
| 4,942,456 A | 7/1990 | Sako | |
| 4,996,577 A | 2/1991 | Kinzer | |
| 5,003,509 A | 3/1991 | Bosnyak | |
| 5,340,993 A | 8/1994 | Salina et al. | |
| 5,372,565 A | 12/1994 | Burdenko | |
| 5,389,578 A | 2/1995 | Hodson et al. | |
| 5,514,892 A | 5/1996 | Countryman et al. | |
| 5,600,174 A | 2/1997 | Reay | |
| 5,629,838 A | 5/1997 | Knight | |
| 5,796,570 A | 8/1998 | Mekdhanasarn et al. | |
| 5,929,514 A | 7/1999 | Yalamanchili | |
| 5,990,519 A | 11/1999 | Huang-Lu et al. | |
| 6,031,251 A | 2/2000 | Gempe et al. | |
| 6,111,305 A | 8/2000 | Yoshida et al. | |
| 6,242,987 B1 | 6/2001 | Schopf et al. | |
| 6,300,632 B1 | 10/2001 | Liu et al. | |
| 6,351,011 B1 | 2/2002 | Whitney et al. | |
| 6,359,276 B1 | 3/2002 | Tu | |
| 6,365,433 B1 | 4/2002 | Hyoudo et al. | |
| 6,507,264 B1 | 1/2003 | Whitney | |
| 6,509,574 B2 | 1/2003 | Yuan et al. | |
| 6,696,752 B2 | 2/2004 | Su et al. | |
| 6,815,808 B2 | 11/2004 | Hyoudo et al. | |
| 6,821,822 B1 | 11/2004 | Sato | |
| 6,921,704 B1 | 7/2005 | Wu et al. | |
| 6,977,468 B1 | 12/2005 | Baginski | |
| 7,015,587 B1 | 3/2006 | Poddar | |
| 7,321,162 B1 | 1/2008 | Lee et al. | |
| 7,334,326 B1 | 2/2008 | Huemoeller et al. | |
| 7,436,054 B2 | 10/2008 | Zhe | |
| 7,732,892 B2 | 6/2010 | Jeng et al. | |
| 7,749,797 B2 | 7/2010 | Bauer et al. | |
| 7,842,542 B2 | 11/2010 | Shim et al. | |
| 7,869,180 B2 | 1/2011 | Cheung et al. | |
| 8,018,705 B2 | 9/2011 | Michalopoulos et al. | |
| 8,159,056 B1 | 4/2012 | Kim et al. | |
| 8,433,084 B2 | 4/2013 | Conti | |
| 8,436,460 B1 | 5/2013 | Gamboa et al. | |
| 8,569,082 B2 | 10/2013 | Kummerl et al. | |
| 8,633,551 B1 | 1/2014 | Teh et al. | |
| 9,006,857 B1 | 4/2015 | Carr | |
| 9,129,826 B2* | 9/2015 | Lee | H01L 24/32 |
| 9,160,423 B2 | 10/2015 | Brauchler et al. | |
| 9,184,012 B2 | 11/2015 | Wang | |
| 9,219,028 B1 | 12/2015 | Higgins et al. | |
| 9,419,075 B1 | 8/2016 | Carothers et al. | |
| 9,748,207 B2 | 8/2017 | Krause et al. | |
| 9,754,848 B2 | 9/2017 | Jun et al. | |
| 9,761,543 B1* | 9/2017 | Male | H10N 10/17 |
| 9,926,188 B2 | 3/2018 | Classen et al. | |
| 9,929,110 B1 | 3/2018 | Male et al. | |
| 10,002,700 B2 | 6/2018 | Lan et al. | |
| 10,022,018 B2 | 7/2018 | Egger | |
| 10,089,540 B2 | 10/2018 | May | |
| 10,112,013 B2 | 10/2018 | Guillermo | |
| 10,242,917 B2 | 3/2019 | Kim | |
| 10,861,796 B2 | 12/2020 | Cook et al. | |
| 2001/0032054 A1 | 10/2001 | Kimoto et al. | |
| 2003/0141802 A1 | 7/2003 | Liebeskind et al. | |
| 2003/0183916 A1 | 10/2003 | Heck et al. | |
| 2003/0222205 A1 | 12/2003 | Shoji | |
| 2004/0080025 A1 | 4/2004 | Kasahara et al. | |
| 2004/0084729 A1 | 5/2004 | Leung et al. | |
| 2004/0111881 A1 | 6/2004 | Yang et al. | |
| 2005/0170656 A1 | 8/2005 | Nasiri et al. | |
| 2005/0179102 A1 | 8/2005 | Weiblen | |
| 2005/0218300 A1 | 10/2005 | Quinones et al. | |
| 2005/0221517 A1 | 10/2005 | Speyer et al. | |
| 2006/0063462 A1 | 3/2006 | Ding | |
| 2006/0087000 A1 | 4/2006 | Okuno | |
| 2006/0205106 A1 | 9/2006 | Fukuda | |
| 2006/0281334 A1 | 12/2006 | Shin et al. | |
| 2007/0076421 A1 | 4/2007 | Kogo | |
| 2007/0108388 A1 | 5/2007 | Lane et al. | |
| 2007/0138395 A1 | 6/2007 | Lane et al. | |
| 2007/0152308 A1 | 7/2007 | Ha et al. | |
| 2007/0158826 A1* | 7/2007 | Sakakibara | H04R 1/04 257/723 |
| 2007/0229177 A1 | 10/2007 | Moriya | |
| 2007/0278897 A1 | 12/2007 | Ozaki | |
| 2008/0217759 A1 | 9/2008 | Lin et al. | |
| 2008/0227286 A1 | 9/2008 | Gaillard | |
| 2008/0266730 A1 | 10/2008 | Viborg et al. | |
| 2008/0290486 A1 | 11/2008 | Chen et al. | |
| 2009/0052214 A1 | 2/2009 | Edo et al. | |
| 2009/0085191 A1 | 4/2009 | Najafi et al. | |
| 2009/0114901 A1 | 5/2009 | Xie | |
| 2009/0115049 A1 | 5/2009 | Shiraishi et al. | |
| 2009/0127638 A1 | 5/2009 | Kilger et al. | |
| 2009/0261430 A1 | 10/2009 | Suzuki et al. | |
| 2010/0052082 A1 | 3/2010 | Lee et al. | |
| 2010/0187652 A1 | 7/2010 | Yang | |
| 2010/0244234 A1* | 9/2010 | Sonobe | H01L 24/97 438/118 |
| 2010/0252923 A1* | 10/2010 | Watanabe | H01L 24/32 257/E23.06 |
| 2010/0284553 A1 | 11/2010 | Conti et al. | |
| 2011/0061449 A1 | 3/2011 | Yagi et al. | |
| 2011/0084340 A1 | 4/2011 | Yuan et al. | |
| 2011/0089540 A1 | 4/2011 | Drost et al. | |
| 2011/0102005 A1 | 5/2011 | Feng et al. | |
| 2011/0108747 A1 | 5/2011 | Liu | |
| 2011/0220996 A1 | 9/2011 | Kutsukake et al. | |
| 2011/0233790 A1 | 9/2011 | Bchir | |
| 2011/0248374 A1 | 10/2011 | Akin et al. | |
| 2011/0316113 A1 | 12/2011 | Noda | |
| 2012/0142144 A1 | 6/2012 | Taheri | |
| 2012/0153771 A1 | 6/2012 | Formosa et al. | |
| 2012/0212925 A1* | 8/2012 | Zoellin | G01L 19/0084 361/807 |
| 2012/0299127 A1 | 11/2012 | Fujii et al. | |
| 2013/0001710 A1 | 1/2013 | Daneman | |
| 2013/0128487 A1 | 5/2013 | Lo et al. | |
| 2013/0134445 A1 | 5/2013 | Tarsa et al. | |
| 2013/0168740 A1 | 7/2013 | Chen | |

(56) References Cited

U.S. PATENT DOCUMENTS

| | | |
|---|---|---|
| 2013/0194057 A1 | 8/2013 | Ruby |
| 2013/0315533 A1 | 11/2013 | Tay et al. |
| 2013/0320459 A1 | 12/2013 | Shue et al. |
| 2013/0320548 A1 | 12/2013 | Carpenter et al. |
| 2013/0322675 A1* | 12/2013 | Zoellin .................. H04R 19/04 381/355 |
| 2013/0329324 A1 | 12/2013 | Tziviskos et al. |
| 2013/0336613 A1 | 12/2013 | Meade et al. |
| 2014/0001632 A1 | 1/2014 | Uehling et al. |
| 2014/0061840 A1 | 3/2014 | Oguri et al. |
| 2014/0084396 A1 | 3/2014 | Jenkins |
| 2014/0091909 A1 | 4/2014 | Smith et al. |
| 2014/0260541 A1 | 9/2014 | Lakhotia et al. |
| 2014/0264905 A1 | 9/2014 | Lee et al. |
| 2014/0298825 A1 | 10/2014 | Noshadi |
| 2015/0004902 A1 | 1/2015 | Pigott |
| 2015/0023523 A1 | 1/2015 | Elian et al. |
| 2015/0035091 A1 | 2/2015 | Ziglioli |
| 2015/0069537 A1 | 3/2015 | Lo et al. |
| 2015/0094875 A1 | 4/2015 | Duzly et al. |
| 2015/0104895 A1 | 4/2015 | Cheng |
| 2015/0175406 A1 | 6/2015 | Lin et al. |
| 2015/0180425 A1 | 6/2015 | Lukashevich |
| 2015/0198551 A1 | 6/2015 | Jun et al. |
| 2015/0198493 A1 | 7/2015 | Kaelberer et al. |
| 2015/0249043 A1 | 9/2015 | Elain |
| 2015/0255693 A1 | 9/2015 | Baade et al. |
| 2015/0344296 A1* | 12/2015 | Pahl ..................... B81C 1/0023 438/51 |
| 2015/0369681 A1 | 12/2015 | Imai |
| 2015/0369682 A1 | 12/2015 | Nakajima |
| 2015/0372034 A1 | 12/2015 | Chen et al. |
| 2015/0380353 A1 | 12/2015 | Bauer |
| 2016/0003436 A1 | 1/2016 | Singer |
| 2016/0013771 A1 | 1/2016 | Sridaran et al. |
| 2016/0029685 A1 | 2/2016 | Tang |
| 2016/0049341 A1 | 2/2016 | Pontarollo et al. |
| 2016/0064696 A1 | 3/2016 | Collier et al. |
| 2016/0087034 A1 | 3/2016 | You et al. |
| 2016/0090297 A1 | 3/2016 | Zhang |
| 2016/0100256 A1 | 4/2016 | Watson et al. |
| 2016/0103082 A1 | 4/2016 | Kimura |
| 2016/0167089 A1 | 6/2016 | Ng |
| 2016/0209285 A1 | 7/2016 | Nakajima |
| 2016/0241953 A1 | 8/2016 | Elian et al. |
| 2016/0261941 A1 | 9/2016 | Brioschi et al. |
| 2017/0022049 A1 | 1/2017 | Chu et al. |
| 2017/0040335 A1 | 2/2017 | Lim et al. |
| 2017/0047271 A1 | 2/2017 | Zapico |
| 2017/0089789 A1 | 3/2017 | Kanemoto |
| 2017/0134004 A1 | 5/2017 | Isozaki |
| 2017/0275157 A1 | 9/2017 | Zhu et al. |
| 2017/0330841 A1 | 11/2017 | Cook et al. |
| 2019/0198487 A1 | 6/2019 | Udrea |

FOREIGN PATENT DOCUMENTS

| | | |
|---|---|---|
| GB | 2521619 | 1/2015 |
| JP | 2010230655 A | 10/2010 |
| JP | 2010238731 A | 10/2010 |
| KR | 20170018165 | 2/2017 |
| KR | 20170018165 A | 2/2017 |
| RU | 2169962 | 6/2001 |
| RU | 2201017 | 3/2003 |
| RU | 2263999 | 7/2005 |

OTHER PUBLICATIONS

Search Report for European Patent Application No. 17796774.2-112, PCT/US2017/031987, dated May 9, 2019, 2 pgs.
Supplementary Search Report for European Patent Application No. 17886649.7, Dec. 13, 2019, 7 pgs.
Clark, C.G., "The Basics of Arc Flash", GE Industrial Solutions, http://apps.geindustrial.com/publibrary/checkout/ArcFlash4? TNR=White%20Papers%7CArcFlash4%7Cgeneric , 3 pgs.
European Patent Office, Search Report for Application No. 117796774.2-1212, mailed Jul. 9, 2020, 8 pgs.
European Patent Office, Search Report for European Patent Application No. 17796774.2, May 9, 2019, 2 pgs.
European Search Report for 17796774.2 mailed May 9, 2019.
Office Action for European Patent Application No. 17796774.2, mailed Jul. 9, 2020, 8 pages.
National Semiconductor Corporation, "Semiconductor Packaging Assembly Technology," National Semiconductor Corporation, Aug. 1999, pp. 1-8.
Cook, et al.: "Floating Die Package"; U.S. Appl. No. 15/248,151; filed Aug. 26, 2016; 34 pages (TI-76980).
Texas Instruments Product Brochure ISO7841x High-Performance, 8000-Vpk Reinforced Quad-Channel Digital Isolator, dated Nov. 2014 (37 pages).
Texas Instruments Developers Guide "Digital Isolator Design Guide," SLLA284A, Jan. 2009 (19 pages).
Wikipedia article "3D Printing," retrieved from "http://en.wikipedia.org/w/index.php?title=3D_printing&oldid=624190184", dated Sep. 4, 2014 (35 pages).
OSRAM Opto Semiconductors GmbH, Oslon Compact (850nm), version 1.6, SFH 4710, dated Dec. 1, 2015 (13 pages).
Maloberti, F., "Layout of Analog CMOS Integrated Circuit, Part 2 Transistors and Basic Cells Layout," retrieved from http://ims.unipv.it/Courses/download/AIC/Layout02.pdf, dated Mar. 15, 2004 (38 pages).
Texas Instruments Application Report "The ISO72x Family of High-Speed Digital Isolators," SLLA198—Jan. 2006 (12 pages).
International Search Report for PCT/US2017/068983 mailed May 17, 2018. (77356WO).
International Search Report for PCT/US2017/031987 mailed Sep. 7, 2017.
International Search Report for PCT/US2017/068997 mailed May 24, 2018. (77261WO).
Extended European Search Report for 17886649.7 mailed Jan. 8, 2020.
Office Action for 17796774.2 (TI-76980EP), mailed Sep. 7, 2020.
Supplementary Search Report for European Patent Application No. 17886649.7, date of search Dec. 13, 2019, 1 page.
Notification of Transmittal of the International Search Report and the Written Opinion of the International Searching Authority, or the Declaration, mail date: May 24, 2018, 8 pages.
Office Action for European Patent Application No. 17796774.2, mailed Apr. 19, 2022, 7 pages.
CN Office Action mailed May 6, 2020.
United States Patent and Trademark Office, Office action for U.S. Appl. No. 16/247,118, dated Mar. 22, 2023, 12 pages.
European Patent Office, Office Action for TI-76980EP, dated Apr. 19, 2022, 9 pages.

* cited by examiner

FLOATING DIE PACKAGE

CLAIM OF PRIORITY AND RELATED PATENT APPLICATIONS

This nonprovisional application is a continuation of U.S. patent application Ser. No. 15/248,151, filed Aug. 8, 2016, which claims priority based upon the following prior United States provisional patent application(s): (i) "FLOATING DIE STRESS FREE PACKAGE," Application No. 62/334,133, filed May 10, 2016, in the name(s) of Benjamin Stassen Cook, Steven Kummerl and Kurt Peter Wachtler; each of which is hereby incorporated by reference in its entirety.

FIELD OF THE DISCLOSURE

This disclosure relates generally to the field of semiconductor devices and the methods of fabrication thereof, and more particularly, without limitation, to a die package and associated fabrication process.

BACKGROUND

A semiconductor package is a metal, plastic, glass or ceramic casing containing one or more semiconductor dies or components. It is well known that packaging plays a fundamental role in the operation and performance of a component such as a semiconductor integrated circuit (IC) or die. Besides providing a means of bringing signal and supply wires in and out of the silicon die, it also removes the heat generated by the circuit and provides mechanical support. Finally, its also protects the die against environmental conditions such as humidity. Furthermore, the packaging technology continues to have a major impact on the performance and power-dissipation of high-performance components such as microprocessors, signal processors, etc. This influence is getting more pronounced as time progresses by the reduction in internal signal delays and on-chip capacitance as a result of technology scaling.

It is also known that high precision ICs today are influenced by post-assembly packaging stresses resulting in parametric shifting and potential drift over temperature. For example, electrical characteristics such as threshold voltages of transistors, high precision reference voltages of ICs, etc. are known to drift due to thermo-mechanical stresses caused by the packaging materials. Conventional solutions to date typically rely on employing materials of low modulus of elasticity, which still have a high Coefficient of Thermal Expansion (CTE), however. Accordingly, although stress immunity may be improved, IC devices packaged in such technologies still show both stress and temperature drift of parametrics.

One skilled in the art will therefore appreciate that semiconductor devices including both active and inactive components, bonding technologies and packaging processes constantly have to be improved with respect to achieving high performance, high reliability and reduced manufacturing costs.

SUMMARY

The following presents a simplified summary in order to provide a basic understanding of one or more aspects of the invention. This summary is not an extensive overview of the invention, and is neither intended to identify key or critical elements of the invention, nor to delineate the scope thereof. Rather, the primary purpose of the summary is to present some concepts of the invention in a simplified form as a prelude to a more detailed description that is presented later.

Broadly, embodiments of the present invention are directed to a floating die package and its manufacture. The package includes a cavity formed through sublimation of a sacrificial die encapsulant. Also, sublimation and/or delamination of die attach materials may be effectuated after molding assembly in a variation. One or more pinhole vents or apertures in the molding structure may be provided as a sublimation path to allow gases to escape, whereby the die or die stack is released from the substrate and suspended in the cavity by the bond wires only.

In one aspect, an embodiment of a method of fabricating a semiconductor die package is disclosed. The claimed method may comprise, inter alia, die preparation that may involve singulating one or more semiconductor dies from a semiconductor wafer, each semiconductor die having a plurality of bond pads. The singulated semiconductor die is attached to a substrate having a plurality of electrical conductors or conductive fingers, wherein the attaching comprises suitable application of a select die attach material. In one implementation, the select die attach material may comprise a sublimatable substance. The die attach material may be cured in one or more stages, followed by wire-bonding the bond pads of the at least one singulated semiconductor die to the plurality of electrical conductors of the substrate using a corresponding number of bond wires. A select sublimatable sacrificial encapsulant material is applied to result in a glob or bump structure covering at least a portion of the singulated die and at least a portion of the substrate including the bond wires. The bump structure of the sublimatable sacrificial die encapsulant material may also be cured in one or more stages. A select molding material is applied to cover, encase or otherwise seal the bump structure and the substrate, wherein at least a pinhole vent having a select shape and size is created in the molding material so as to provide a sublimation path for the sublimatable sacrificial encapsulant material at a later stage. In one example implementation, the molding material may be cured in one or more stages, preferably without causing sublimation of the sublimatable materials at this step. A sublimation process is then effectuated to gasify the sublimatable sacrificial encapsulant material, thereby allowing the gasified encapsulant material to escape through the pinhole vent of the molding, thereby creating a cavity. In other variations, the die attach material may also be sublimated, delaminated, or kept intact, depending on implementation. The molding structure including the pinhole vent is then covered or sealed with a film layer to complete fabrication of the semiconductor die package containing the at least one singulated die disposed in the cavity.

In another aspect of the present invention, an embodiment of a semiconductor die package is disclosed. The claimed embodiment comprises, inter alia, a substrate having a plurality of electrical conductors and at least one semiconductor die having a plurality of bond pads that are wire-bonded to the plurality of electrical conductors of the substrate using a corresponding number of bond wires. A molding structure covering or otherwise sealing at least a portion of the semiconductor die, the substrate and the bond wires therebetween is provided, wherein the molding structure contains a cavity or chamber formed by: (i) depositing of a sacrificial encapsulant material over the at least one semiconductor die prior to molding; and (ii) sublimation of the sacrificial encapsulant material through a pinhole vent of the molding structure, and further wherein the cavity provides a space in which the at least one semiconductor die is disposed floating over the substrate on account of sublimation or shrinkage/delamination of a die attach material deposited between the at least one semiconductor die and the substrate. A film layer is disposed over or on the molding structure, hermetically sealing the pinhole vent formed therein for providing a sublimation path.

BRIEF DESCRIPTION OF THE DRAWINGS

Embodiments of the present disclosure are illustrated by way of example, and not by way of limitation, in the Figures of the accompanying drawings in which like references indicate similar elements. It should be noted that different references to "an" or "one" embodiment in this disclosure are not necessarily to the same embodiment, and such references may mean at least one. Further, when a particular feature, structure, or characteristic is described in connection with an embodiment, it is submitted that it is within the knowledge of one skilled in the art to effect such feature, structure, or characteristic in connection with other embodiments whether or not explicitly described.

The accompanying drawings are incorporated into and form a part of the specification to illustrate one or more exemplary embodiments of the present disclosure. Various advantages and features of the disclosure will be understood from the following Detailed Description taken in connection with the appended claims and with reference to the attached drawing Figures in which:

FIGS. 2A-1 and 2A-2 illustrate example interim packaging structures resulting from an implementation of the process flow of FIG. 1A according to one or more embodiments of the present invention;

FIGS. 2B-1 to 2B-3 illustrate example finished packaging structures resulting from an implementation of the process flow of FIG. 1B according to one or more embodiments of the present invention;

DETAILED DESCRIPTION OF THE DRAWINGS

The present invention is described with reference to the attached Figures wherein like reference numerals are generally utilized to refer to like elements throughout. The Figures are not drawn to scale and they are provided merely to illustrate the invention. Several aspects of the invention are described below with reference to example applications for illustration. It should be understood that numerous specific details, relationships, and methods are set forth to provide an understanding of the invention. One skilled in the relevant art, however, will readily recognize that the invention can be practiced without one or more of the specific details or with other methods. In other instances, well-known structures or operations are not shown in detail to avoid obscuring the invention. The present invention is not limited by the illustrated ordering of acts or events, as some acts may occur in different orders and/or concurrently with other acts or events. Furthermore, not all illustrated acts or events are required to implement a methodology in accordance with the present invention.

In the following description, reference may be made to the accompanying drawings wherein certain directional terminology, such as, e.g., "upper", "lower", "top", "bottom", "left-hand", "right-hand", "front side", "backside", "vertical", "horizontal", etc., may be used with reference to the orientation of the Figures or illustrative elements thereof being described. Since components of embodiments can be positioned in a number of different orientations, the directional terminology is used for purposes of illustration and is in no way limiting. It is understood that further embodiments may be utilized and structural or logical changes may be made without departing from the scope of the present invention. The features of the various exemplary embodiments described herein may be combined with each other unless specifically noted otherwise.

As employed in this specification, the terms "coupled", "electrically coupled", "connected" or "electrically connected" are not meant to mean that elements must be directly coupled or connected together. Intervening elements may be provided between the "coupled", "electrically coupled", "connected" or "electrically connected" elements.

Example semiconductor devices described below may include or formed of a semiconductor material like Si, SiC, SiGe, GaAs or an organic semiconductor material. The semiconductor material may be embodied as a semiconductor wafer or a semiconductor chip containing any type of ICs, for example including but not limited to, digital, analog, mixed-signal, or power semiconductor chips. An example semiconductor chip or die may include integrated circuits, control circuits to control integrated circuits, one or more memory/processor cores and associated peripheral circuits, and/or microelectromechanical components or systems (MEMS), inter alia. The semiconductor chip may further include inorganic and/or organic materials that are not semiconductors, for example, insulators such as dielectric layers, plastics or metals, etc.

Examples of semiconductor devices that may be packaged according an embodiment of the present invention may include a plurality of bonding pads (also referred to as contact pads or bond pads) which may be made of or include a metal, e.g., copper (Cu), aluminum (Al), etc., and may further comprise one or more layers of diffusion barrier layers. For example, a multi-level/layer Cu diffusion barrier metal, e.g., comprising nickel-palladium (Ni—Pd), tantalum nitride (TaN)—Ni—Pd, and the like, may be applied. The contact pads may be configured to provide electrical connections between an integrated circuit of the semiconductor device and respective connecting elements connected to a substrate. Possibilities for establishing contact with the bond pads may include soldering, wire bonding, clip bonding, flip chip mounting and probe needles, among others. The connecting element may thus be embodied as a bonding wire or a bonding clip in some example embodiments.

Example bonding wires (or, bond wires) that may be bonded to contact pads in an example packaging process described below may include a wire core which may include a metal or a metal alloy, e.g., Cu or Cu alloy and may further include a coating material arranged over the wire core. For example, an embodiment may include a coating material comprising one of palladium-coated materials (e.g., Pd-coated copper or PCC), and the like. The wire diameter may have a thickness ranging from less than a micron to several hundred microns, depending on application. In an example embodiment, wire diameters may be between 15 to 250 microns (μm) depending on a particular application. The wire core may have a substantially circular cross section such that term "thickness" of the wire core may refer to the diameter of the wire core.

Example semiconductor devices, dies, or die stacks that may be packaged according to an embodiment of the present invention may comprise contact pads that have been formed using a number of surface conditioning processes, e.g., including wet clean, chemical clean, dry or plasma clean, etc.

The bonding wires or materials that may be bonded to contact pads of the present invention may include a passivation layer, for example, an oxide layer. In this connection, the term "passivation" may refer to avoiding or inhibiting oxidation and corrosion of a material sheathed by or arranged underneath the passivation layer. For example, the passivation layer may be generated via a spontaneous formation of a hard non-reactive surface film (spontaneous passivation). The passivation layer may have a thickness between 1 and 10 nm, in particular, between 4 and 8 nm in some example embodiments.

Figure 1A:
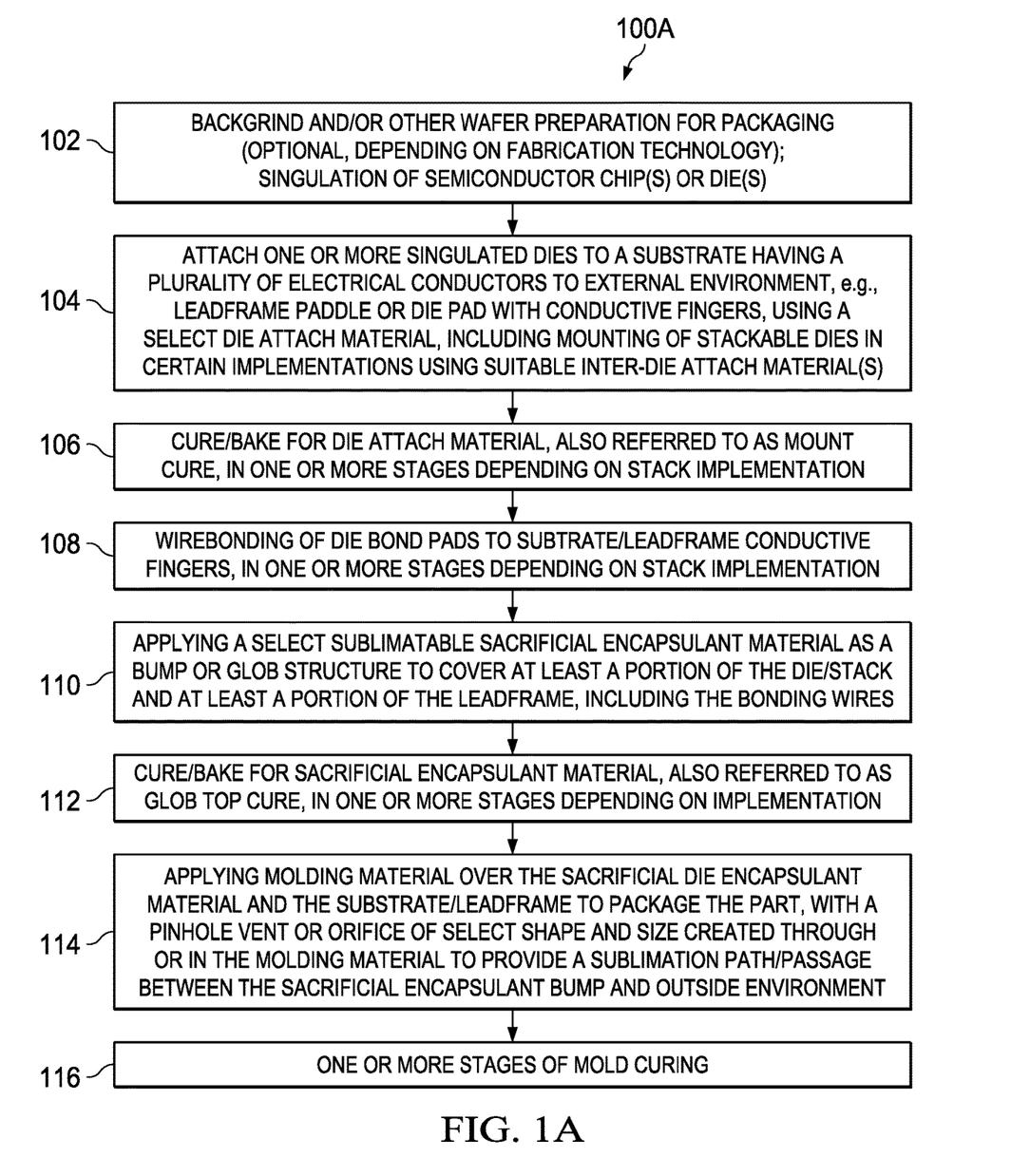
FIGS. 1A and 1B illustrate an example die packaging process as part of a backend semiconductor fabrication flow according to an embodiment of the present invention.
Figure 1B:
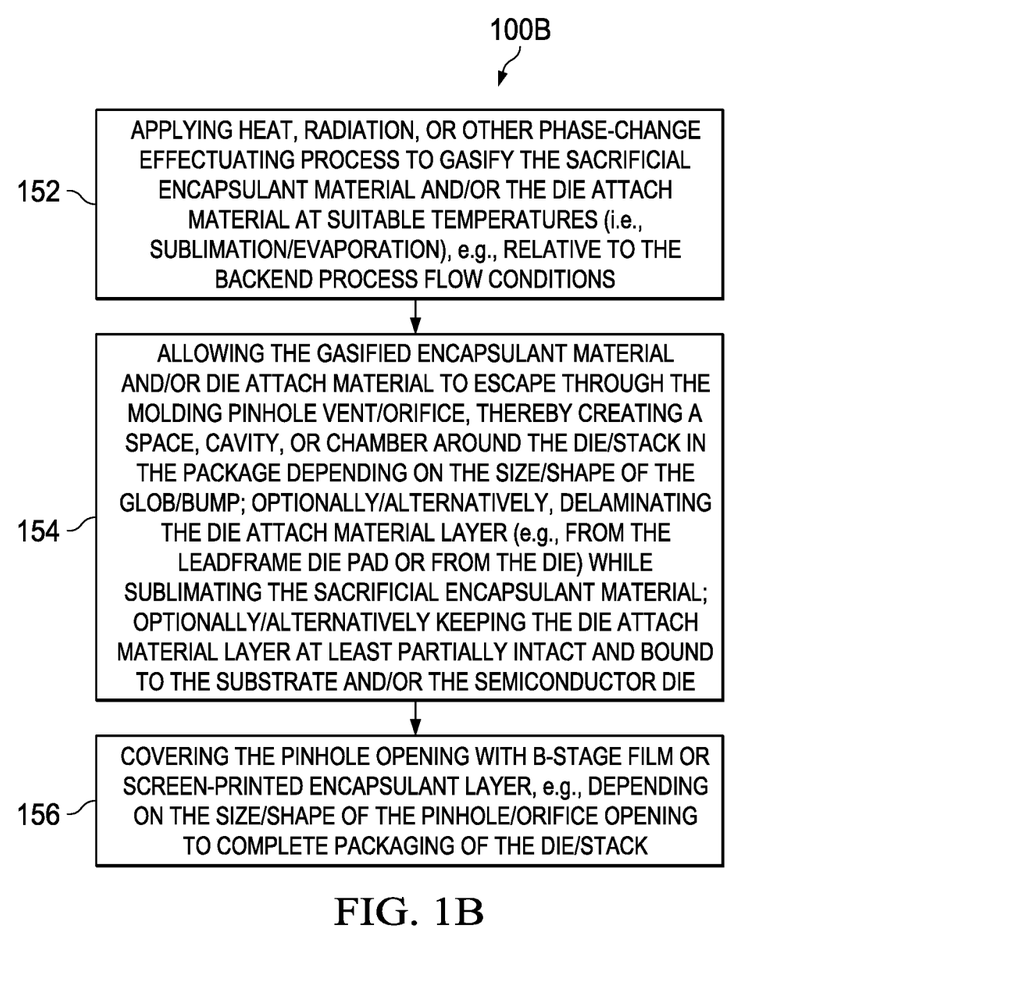

Referring now to the drawings and more particularly to FIGS. 1A and 1B, depicted therein is an example die packaging process 100A, 100B as part of a backend semiconductor fabrication flow according to an embodiment of the present invention. Reference numeral 100A in FIG. 1A broadly refers to a first part of the flow which may involve various stages of die preparation, depending on the type of semiconductor devices involved, fabrication technologies and backend foundry flows. As part of singulation of the individual semiconductor dies or chips from wafers (i.e., "dicing") for packaging, a number of processes involving wafer sort, visual/automated inspection, backing tape mounting, wafer sawing and deionized (DI) water cleaning and lubrication, etc. may be performed. Further, for certain types of semiconductor devices, wafer backgrind operations may also be performed (additionally or optionally) prior to dicing in order to remove sufficient wafer substrate material from the backside and thereby obtain a select thinness or thickness in varying ranges (e.g., from about 50 μm to several hundred microns. Also depending on the fabrication process, one or more suitable backside metal layers (e.g., comprising titanium (Ti), titanium-nickel-argentum (Ti—Ni—Ag), nickel-vanadium (Ni—V), etc.) may also be deposited over the wafer's backside substrate. These preparation steps are collectively illustrated at block 102.

Subsequent to die preparation, a number of die attach related steps may be performed, which again may involve one or more process stages, one or more singulated semiconductor dies, etc. depending on the type of semiconductor devices involved, packaging technologies and backend foundry flows. In accordance with the teachings of the present invention, a first semiconductor die (which may also be referred to as a bottom die or at least one singulated semiconductor die, depending on whether a multi-die or multi-chip configuration is being packaged) may be mounted or otherwise attached to a substrate having a plurality of electrical conductors, e.g., a leadframe paddle or die pad and associated conductive fingers, using a select die attach material in accordance with the teachings of the present invention, as set forth block 104. In one embodiment, the die attach material may comprise a material, substance, or compound that is or remains non-sublimatable with respect to the range(s) of process parameters of the backend/package processing. In another embodiment, the die attach material may comprise a material, substance, or compound that can shrink, delaminate, shrivel, contract, retract, or otherwise detach, either partially or completely, either from the semiconductor die or from the substrate, in or during one or more downstream process steps. In another embodiment, the die attach material may comprise a material, substance, or compound that may be sublimated in one or more downstream process steps. In this variation, such a die attach material may preferably be sublimated at suitable temperature ranges relevant to an example package flow parameters. Also, the entire die attach material (e.g., complete sublimation) or at least a portion of the material may be sublimated (e.g., partial sublimation). Example sublimatable materials that may be used for purposes of the present invention will be described further below in connection with some of the subsequent processing steps involving sublimation.

Example process flow 100A may involve curing/backing of the die attach materials (and inter-die attach materials where a stacked die configuration is implemented), preferably in one or more stages depending on the technology and backend foundry flows (block 106), which may be referred to as mount cure process(es). One skilled in the art will recognize that where an example packaging flow involves multiple dies per package, additional dies may be attached together, e.g., in a vertical stack configuration, on top of a bottom die, using conventional non-sublimatable inter-die attach materials in one illustrative implementation, wherein a sublimatable underfill may be provided to attach the bottom die to the substrate. In such stacked die arrangements, the bottom die may be first attached and cured, followed by attaching a next die on top of the bottom die using a non-sublimatable inter-die attach material and curing it thereafter, and so on. Accordingly, in one embodiment, each die in a stack may be attached and cured separately and sequentially until a top die of the stack is attached and cured. A skilled artisan will therefore appreciate that an example stacked die configuration may include different types of semiconductor devices, wherein each die's curing process may involve multiple stages, for example comprising different temperature and time ranges, which may be different from those of other dies of the stack.

In one example implementation, bottom die attach materials may be provided as a conductive underfill whereas the inter-die attach materials may be nonconductive. Also, the die attach materials may be applied using a variety of technologies, e.g., using a syringe dispensing mechanism.

In a further example implementation, a first mount cure process may comprise a first stage temperature range of a minimum of 170° C. to a maximum of 180° C., with a preferred temperature of 175° C., which first stage may be applied for a first time duration of 25-35 minutes, having a preferred time of 30 minutes. Likewise, a second stage of the first mount cure process may have a temperature range of 170° C. to 180° C., for a time range of 55-65 minutes. A third and final stage of the first mount cure process may have a temperature range of 70° C. to 80° C., for a time range of 40-50 minutes. In a still further example implementation, a second mount cure process may also comprise three stages with the following process parameters: a first stage having a temperature range of 145° C. to 155° C. for a time range of 25-35 minutes, a second stage having a temperature range of 145° C. to 155° C. for a time range of 60-65 minutes, and a third stage having a temperature range of 75° C. to 85° C. for a time range of 45-55 minutes.

By way of illustration, sample inter-die attach materials and/or non-sublimatable die attach materials may comprise various known or heretofore unknown epoxy resin materials, cyanate ester blend materials, soft solder materials, and eutectic bonding materials, without limitation, that may be selected based on the specific thermo-mechanical properties required of a single die or stack die configuration and associated packaging technology.

Continuing to refer to FIG. 1A, the die bond pads of the at least one singulated semiconductor die may be wire-bonded to the plurality of electrical conductors of the substrate (e.g., leadframe's conductive fingers) using a corresponding number of bond wires in conjunction with different bonding technologies (block 108). A skilled artisan will recognize that where multiple dies are involved, each die may be wire bonded separately to a corresponding set of conductive fingers, bumps, balls, or posts, and the like. Further, a variety of wire bonding interconnect processes comprising, e.g., ball bonding, wedge bonding, ribbon bonding, clip bonding and tape-automated bonding (TAB), may be used for connecting bond wires of various metallurgies, e.g., gold (Au), aluminum (Al), or copper (Cu), etc. to the conductive fingers of the substrate. Generally, in each type of bonding, the wire may be attached at both ends (i.e., the bond pad and the corresponding conductive finger) using some combination of heat, pressure, and ultrasonic energy to make a weld.

Figure 2A:
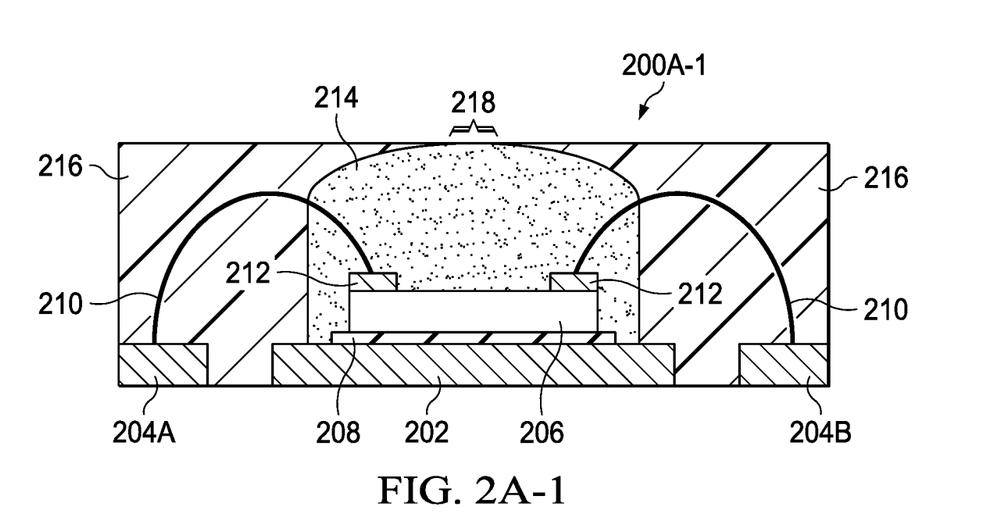
Figure 2A:
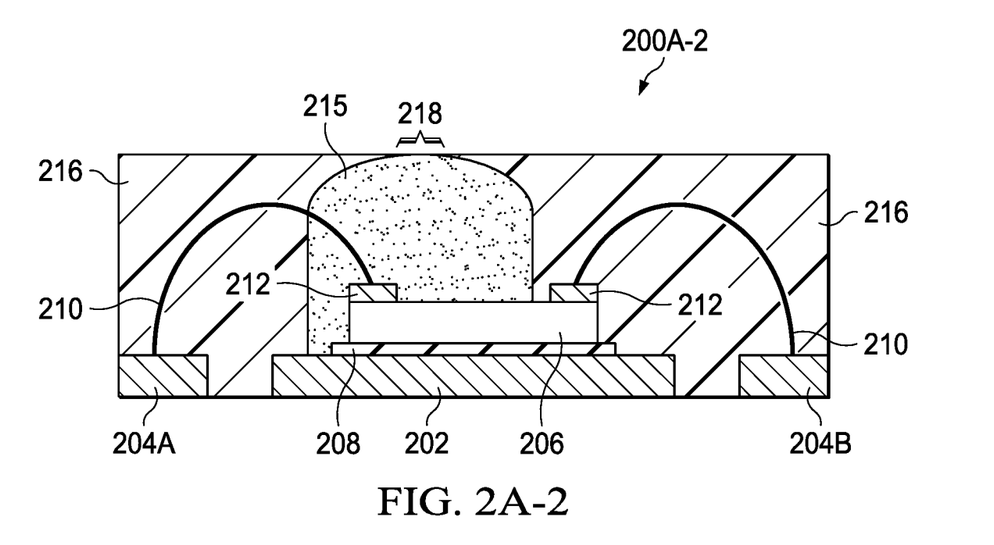
Figure 2B:
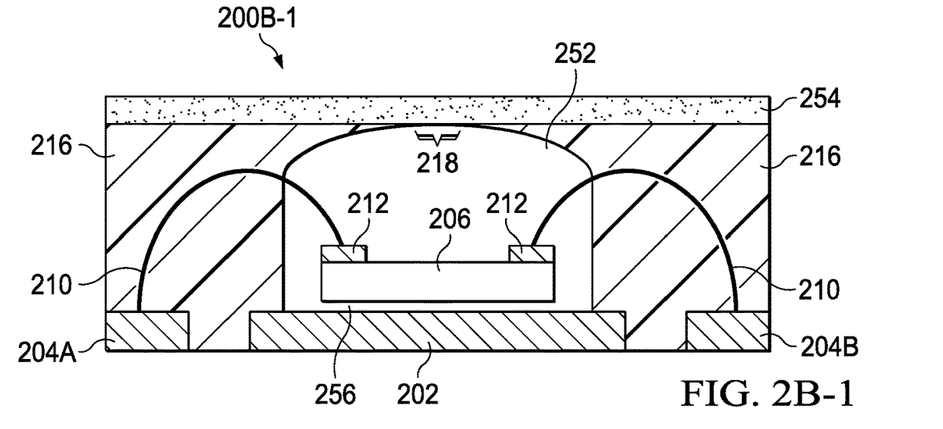
Figure 2B:
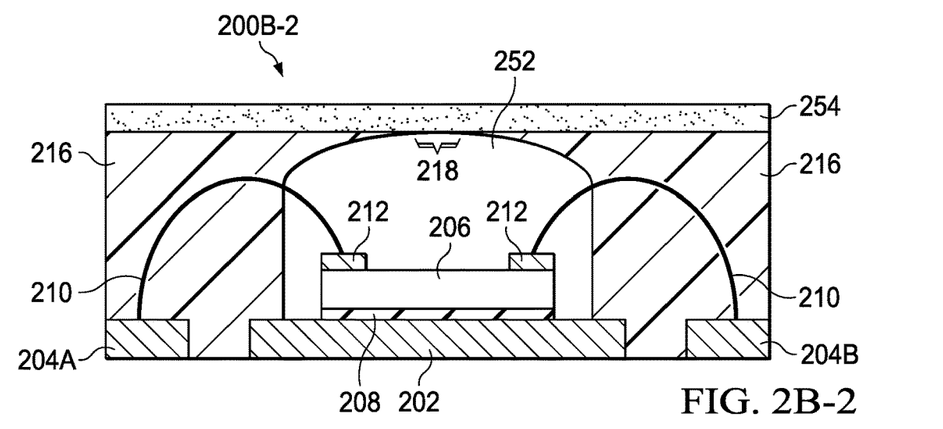
Figure 2B:
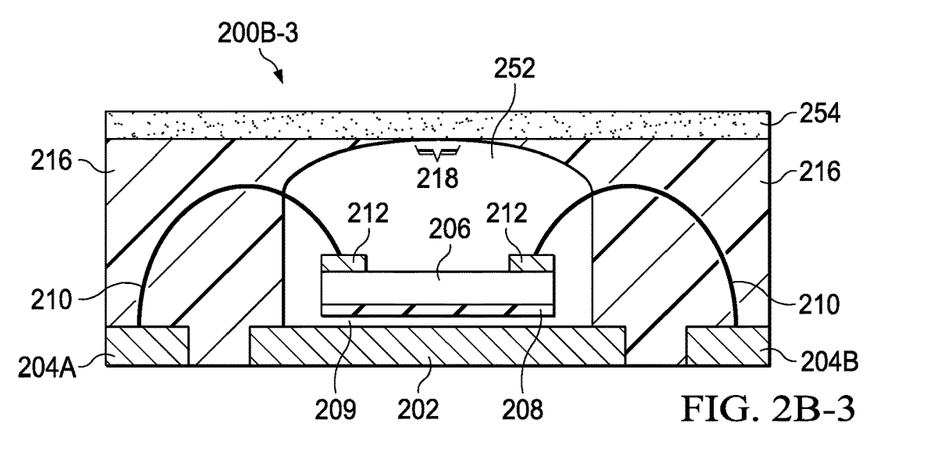
Figure 2C:
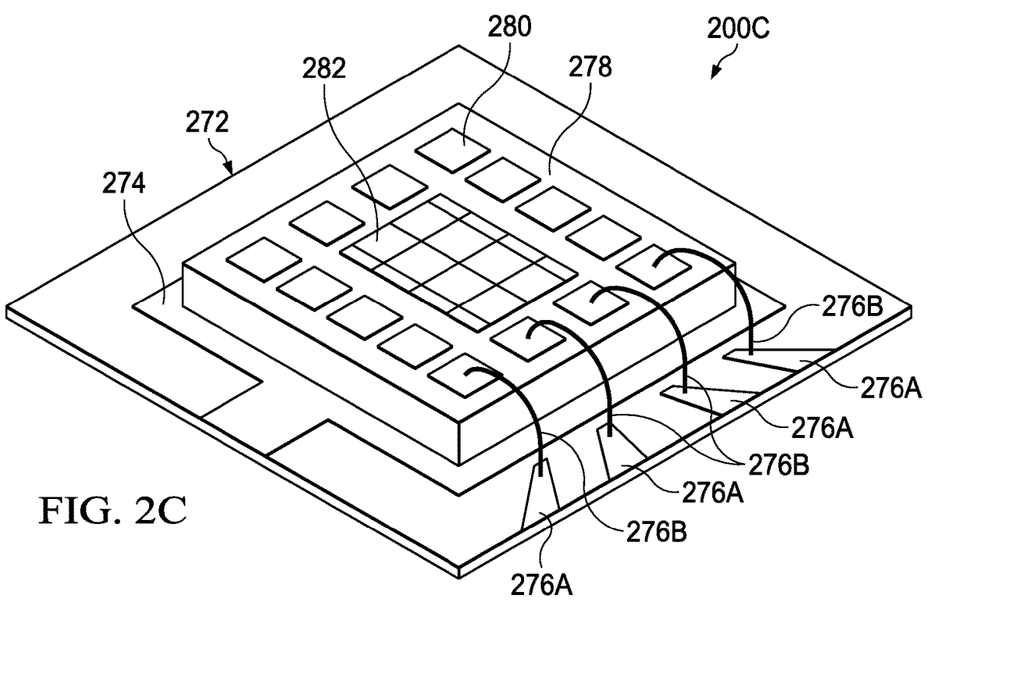
FIG. 2C illustrates an example semiconductor die in association with a leadframe structure operative as a substrate for purposes of an embodiment of the present invention.

Reference is now taken to FIG. 2C, where an example substrate 200C is illustratively provided as a leadframe structure 272 having a die or chip paddle 274 and a plurality of conductive fingers 276A. A semiconductor die 278 including one or more active circuit areas 282 surrounded by a plurality of bond pads 280 is mounted on the leadframe's chip paddle 274. Bond wires 276B, each having a wire diameter of about 15 μm to 25 μm, for example, are illustratively shown as providing a wire connection between the bond pads 280 and conductive fingers 276A correspondingly.

Returning to FIG. 1A, a select sublimatable sacrificial encapsulant material is applied in accordance with the teachings of the present invention as a bump structure having suitable shape and/or size to cover at least a portion of the singulated die (or multiple dies in a stacked die configuration) and at least a portion of the substrate including the bond wires (block 110). In one embodiment, the encapsulant material may encapsulate the die completely, along with portions of bond wires and/or the substrate. In another variation, the encapsulant material may cover only partial areas of the die, subset/portion(s) of the bond wires, and/or the substrate (e.g., at select areas of the die/substrate). These encapsulation variations are illustratively shown at block 110.

The inventors of the present patent application have discovered that materials such as various types of polyols may be advantageously used as sacrificial encapsulant materials and/or sublimatable die attach materials that can sublimate or shrink/delaminate at temperatures outside the wire bonding process windows and molding process windows (described hereinbelow) in order to create a cavity within the package (either partial or complete cavity, depending on implementation) in which a semiconductor die (or die stack) may be suspended only by the bond wires, thereby realizing what may be referred to as a "floating die" that can alleviate and/or overcome post-packaging thermo-mechanical stresses that normally cause undesirable parametric shifts in conventional packaging technologies. Depending on the physical/chemical properties of the polyols and applicable process temperature windows, the selected sublimatable materials may be applied as solids that can be extruded as a melting bead at certain temperatures for depositing over select portions of the die/substrate/bond wires. In another variation, the sublimatable materials may be dissolved in suitable solvents and applied as a solution of appropriate viscosity using a syringe dispensing mechanism that dispenses a bead over the die portions as well as surrounding substrate and bond wire portions (hereinafter referred to as "encapsulated components"). The solvent may be evaporated from the bead, thereby leaving a "glob" of the material over the die and encapsulated components as the bump structure. In yet another variation, a select sublimatable material may be applied as a liquid at room temperature, whereupon it may be cured by radiation (e.g., UV, IR, etc.) that creates cross-linking of chemical bonds to solidify as a bump.

A skilled artisan will recognize that polyols are compounds with multiple hydroxyl functional groups, which can be provided as monomeric or polymeric substances. A molecule with two hydroxyl groups is a diol, one with three is a triol, and so on. Example sublimatable sacrificial encapsulant materials and sublimatable die attach materials may be selected from a group of polyols consisting at least one of, but not limited to, Neopentyl glycol, Trimethyloethane, and 2,5-dimethyl-2,5 hexanediol, whose properties are set forth below.

TABLE A

| Code | Chemical Abstract Service (CAS) No. | Name | Source | Melting Point ° C. | Boiling Point or Sublimation Point ° C. |
| --- | --- | --- | --- | --- | --- |
| NPG | 126-30-7 | Neopentyl glycol | Sigma-Aldrich | 130 | 207 |
| TME | 77-85-0 | Trimethyloethane | Sigma-Aldrich | 200 | 293 |
| DMHD | 110-03-2 | 2,5-dimethyl - 2,5 hexanediol | Sigma-Aldrich | 86 | 214 |

Similar to curing the die attach material as set forth at block 106, the sacrificial die encapsulant material may also be cured/baked in one or more stages depending upon implementation (which may be referred to as a "glob top" cure process), as set forth at block 112. In one example embodiment, a first stage of the glob top cure process may comprise a first stage temperature range of a minimum of 145° C. to a maximum of 155° C., with a preferred temperature of 150° C., which first stage may be applied for a first time duration of 25-35 minutes, having a preferred time of 30 minutes. Likewise, a second stage of the glob top cure process may have a temperature range of 145° C. to 155° C. for a time range of 55-65 minutes and a third and final stage of the glob top mount cure process may have a temperature range of 75° C. to 80° C. for a time range of 40-50 minutes.

At block 114, a select molding material may be applied to cover the bump structure (that encapsulates at least a portion of the singulated semiconductor die or multiple dies in a stack) and at least a portion of the substrate, wherein at least a pinhole vent, aperture, opening or orifice, etc. having a select shape and size is created in the molding material so as to provide a sublimation path for the sublimatable sacrificial encapsulant material (as well as the die attach material if sublimatable) at a later stage. In an example implementation, the molding materials may be selected from plastics, epoxy resins, etc. that may be formulated to contain various types of inorganic fillers such as fused silica, catalysts, flame retardants, stress modifiers, adhesion promoters, and other additives, preferably based on the specific product/part requirements, although other types of molding/packaging materials may also be used. In one example implementation, the select molding material may be applied by a packaging tool having a needle that is brought into contact with the encapsulant bump structure, whereupon the select molding material is deposited around the needle, thereby creating the pinhole vent or opening in the select molding material operating as an escape path or exhaust path for gases from sublimation in post-assembly. Typically, intense heat may be applied to the molding material, which may be liquefied and shaped into the desired form. Also, the select molding material having the pinhole vent may be cured in one or more stages in a mold cure process (block 116). An example mold cure process may involve a temperature range of 170° C. to 180° C. for a time range of 4-5 hours in one implementation.

Reference is now taken to FIG. 2A-1, wherein an example interim packaging structure 200A-1 is shown resulting from an implementation of the process flow of FIG. 1A set forth above according to an example embodiment of the present invention. An example semiconductor die 206 is mounted to a substrate structure comprising a paddle 202 using a die attach material layer 208, which in one embodiment may comprise a sublimatable substance as noted previously. Bond wires 210 are connected between die bond pads 212 and respective plurality of conductors 204A/204B. A bump structure 214 is formed of a suitable sacrificial encapsulant material as described in the foregoing section, covering the entire semiconductor die 206 and at least the portion of the substrate 202 on which the die 206 is attached. A molding structure 216 covers the bump structure 214 and the substrate structure including the conductors 204A/204B, wherein at least one pinhole vent 218 is formed over the bump structure 214, thereby providing an escape path for gases that may be formed during sublimation in a post-assembly process. In a further variation, one or more holes or apertures may be provided alternatively or additionally in the substrate 202 for operating as a sublimation path to allow outgassing of sublimatable materials. For example, the substrate 202 may be provided with at least a hole that is small enough that the viscosity of the glob top material would not wet through completely. In one such arrangement, the top pinhole vents 218 may be eliminated altogether, thereby relying on the bottom substrate apertures for facilitating gas removal.

In a still further variation, an example interim packaging structure 200A-2 of FIG. 2A-2 illustrates a partial encapsulation of the semiconductor die 206, wherein a partial bump structure 215 is shown to cover the semiconductor die 206 and the substrate 202 only partially. Similar to the example embodiment of FIG. 2A-1, molding structure 216 covers the partial bump structure 215 and the substrate structure including at least a portion of bond wires 210 and conductive fingers 204A, wherein at least one pinhole vent 218 (i.e., sublimation vent(s)) is formed over the partial bump structure 215 as a sublimation path. One skilled in the art will recognize various modifications to the embodiments of FIGS. 2A-1 and 2A-2 may be realized within the scope of the present invention.

Turning to FIG. 1B, a second part 100B of an example packaging flow broadly involves sublimation and sealing of one or more sublimation vents for completing the package (i.e., post-assembly flow). At block 152, heat, radiation, or other phase-change effectuating energy or process(es) may be applied to gasify the sacrificial encapsulant material of the bump structure 214 (and the die attach material layer 208 in a sublimatable die attach implementation) at suitable temperatures (i.e., sublimation/evaporation), e.g., relative to the backend packaging flow conditions as illustrated above. Preferably, the encapsulant and die attach materials are selected such that temperatures at which they can sublimate or shrink/delaminate may fall outside the wire bonding windows and molding process windows of a particular packaging flow. The gasified encapsulant material and/or die attach material is thereby allowed to escape through the molding pinhole vent/orifice (e.g., pinhole 218 in FIGS. 2A-1 and 2A-2) thereby creating a space, cavity or chamber around the die/stack in the package depending on the size/shape of the glob/bump that was deposited in the process flow 100A of FIG. 1A. Optionally/alternatively, the die attach material layer may not be sublimated. Rather, it may be delaminated, e.g., from the leadframe die paddle or from the die, while sublimating the sacrificial die encapsulant material. In a still further variation, the die attach material may be partially delaminated, i.e., partially intact and bound to the substrate or the semiconductor die. While these processes are illustratively shown in block 154, one skilled in the art will recognize that several additional/alternative implementations may be realized within the scope of the present disclosure. Thereafter, the pinhole vent or opening 218 may be covered or otherwise sealed with a film layer, e.g., comprising a B-stage film or screen-printed encapsulant layer. In an example implementation, selection of a particular film layer to seal the part/package may depend on the size/shape of the pinhole/orifice opening to complete packaging of the die/stack (block 156).

FIG. 2B-1 illustrates an example finished packaging structure 200B-1 resulting from an implementation of the process flow 100B of FIG. 1B according to an embodiment of the present invention, wherein the molding structure 216 contains a cavity or dome 252 is formed by sublimating the sacrificial encapsulant glob 214 covering the entire semiconductor die 206 illustrated in FIG. 2A-1. Also, a separation spacing 256 may be formed between the semiconductor die 206 and the substrate/paddle 202 when a sublimatable die attach layer material 208 is gasified and removed through the pinhole vent 218 in the molding structure 216. Reference numeral 254 refers to a partially cured or B-stage epoxy adhesive provided as a sealing film or layer applied over or on the molding structure 216 in one embodiment. In another embodiment, the film layer 254 may comprise a screen-printed encapsulant film, as noted previously.

In another variation, an example finished packaging structure 200B-2 of FIG. 2B-2 illustrates the scenario where the die encapsulant material is sublimated while the die attach layer 208 is still intact without delamination or separation. In this configuration, although the semiconductor die 206 may still remain attached at the bottom, it is stress-free from any structural components on its top surface. In yet another variation, an example finished packaging structure 200B-3 of FIG. 2B-3 illustrates the scenario where the die encapsulant material is sublimated as before whereas the die attach layer 208 is delaminated/separated from the substrate paddle 202, thereby creating a separation space 209 between the die 206 and the substrate paddle 202. In still further variations, the die attaching material may be sublimated in some areas, while it is still attached (e.g., for structural support) in other areas (for instance, holding down the die at one edge and letting it float on the other). It should be appreciated that depending on whether sublimatable die attach materials are used, coverage of die encapsulation, etc. a number of additional/alternative packaging implementations may be realized within the scope of the present disclosure wherein various levels of stress reduction can be achieved.

One skilled in the art will recognize that depending on the physical-chemical properties as well as phase-transitioning characteristics, a number of polyol materials may be selected for application in different types of packaging flows having varying process conditions according to an embodiment within the scope of the present invention. Sublimation is the transition of a substance directly from the solid phase to the gaseous phase without passing through the intermediate liquid phase. As such, sublimation is an endothermic phase transition that occurs at temperatures and pressures below a substance's triple point in its phase diagram. Accordingly, by controlling these variables, a particular polyol application that is suitable for a specific packaging type may be designed in an example implementation.

Figure 3:
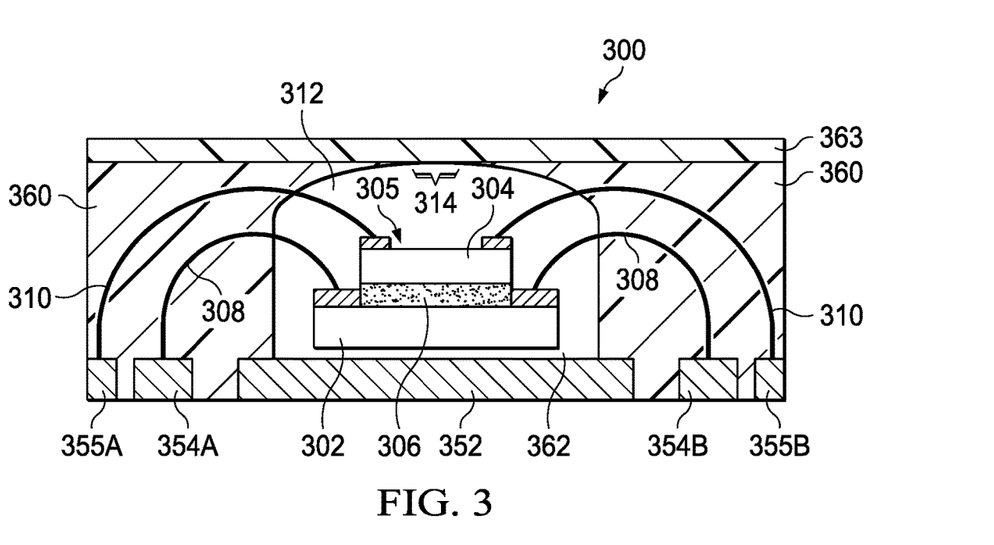
FIG. 3 illustrates an example packaging structure having a stacked die configuration according to another embodiment of the present invention.

FIG. 3 illustrates an example packaging structure 300 having a stacked die configuration according to another embodiment of the present invention. Similar to the single die packaging structure 200B-1 in FIG. 2B-1. a substrate 352 and associated conductive fingers or posts 354A/354B and 355A/355B are covered by a molding structure 360 that includes a cavity or chamber 312 resulting from sublimation of suitable sacrificial encapsulant material applied over a die stack 305. A bottom die 302 is attached to a die on top 304 (i.e., top die) using a suitable nonconductive inter-die attach material 306. The bottom die 302 is separated from the substrate 352 as illustrated by a space 362 therebetween, e.g., due to sublimation of die attach material or shrink/delamination thereof. Separate sets of bond wires 308 and 310 are arranged to couple the bond pads of bottom die 302 and top die 304 to the respective conductive fingers 354A/354B and 355A/355B. A sealing film 363 is provided to hermetically seal the molding structure 360 including vent 314 formed to operate as a sublimation path as discussed above.

Based on the foregoing Detailed Description, one skilled in the art will appreciate that example embodiments advantageously provide an improved die package containing a "no-stress" cavity wherein the die/stack is suspended by the wire bonds only. It should be noted that additional wire bonds can be added as needed or even ribbon bonds may be provided where isolation from mechanical vibration is of particular concern. It should be further appreciated that a floating die package provided in accordance with an embodiment of the present invention would likely experience stresses even less than ceramic-based precision devices, resulting in both a significant cost advantage coupled with increased performance (e.g., by eliminating/reducing parametric drift due to stress and temperature variations).

A skilled artisan will further recognize that the teachings of the present patent application may be practiced in conjunction with various packaging types and technologies such as, e.g., small outline packages (SOP), thin shrink SOP or TSSOP, small outline integrated circuits (SOIC), mini small outline packages (MSOP), plastic dual in-line packages (PDIP), shrink small outline packages (SSOP), quad flat packages (QFPs), plastic leaded chip carriers (PLCC), and the like, to name a few. Additionally or alternatively, various types of bonding technologies may also be used for coupling the bond pads, balls, bumps, etc. of a die to a substrate or die carrier for packaging.

Although various embodiments have been shown and described in detail, the claims are not limited to any particular embodiment or example. None of the above Detailed Description should be read as implying that any particular component, element, step, act, or function is essential such that it must be included in the scope of the claims. Reference to an element in the singular is not intended to mean "one and only one" unless explicitly so stated, but rather "one or more." All structural and functional equivalents to the elements of the above-described embodiments that are known to those of ordinary skill in the art are expressly incorporated herein by reference and are intended to be encompassed by the present claims.

Notwithstanding that the numerical ranges and parameters setting forth the broad scope of the invention are approximations, the numerical values set forth in the specific examples are reported as accurately as possible. Any numerical value, however, inherently contains certain errors necessarily resulting from the standard deviation found in their respective measurements or ranges. Moreover, all ranges disclosed herein are to be understood to encompass any and all sub-ranges subsumed therein. For example, a range of "less than 10" can include any and all sub-ranges between (and including) the minimum value of zero and the maximum value of 10, that is, any and all sub-ranges having a minimum value of equal to or greater than zero and a maximum value of equal to or less than 10, e.g., 1 to 5.

While the invention has been illustrated with respect to one or more implementations or embodiments, alterations and/or modifications can be made to the illustrated examples without departing from the spirit and scope of the appended claims. In addition, while a particular feature of the invention may have been disclosed with respect to only one of several implementations, such feature may be combined with one or more other features of the other implementations as may be desired and advantageous for any given or particular function. Furthermore, to the extent that the terms "including," "includes," "having," "has," "with," or variants thereof are used in either the detailed description and the claims, such terms are intended to be inclusive in a manner similar to the term "comprising." The term "at least one of" is used to mean one or more of the listed items can be selected. Further, in the discussion and claims herein, the term "on" used with respect to two materials, one "on" the other, may mean at least some contact between the materials, while "over" may mean the materials are in proximity, but possibly with one or more additional intervening materials such that contact is possible but not required. Neither "on" nor "over" implies any directionality as used herein. The term "about" indicates that the value listed may be somewhat altered, as long as the alteration does not result in nonconformance of the process or structure to the illustrated embodiment. Finally, "exemplary" indicates the description is used as an example, rather than implying that it is an ideal. Other embodiments of the invention will be apparent to those skilled in the art from consideration of the specification and practice of the invention disclosed herein. It is intended that the specification and examples be considered as exemplary only, with a true scope and spirit of the invention being indicated by the following claims.

What is claimed is:

1. An integrated circuit comprising:
a substrate including first conductors and second conductors;
a first semiconductor die having opposite first and second surfaces, the first surface spaced apart from and facing towards the substrate;
first bond wires coupled between the second surface and the first conductors;
a second semiconductor die having opposite third and fourth surfaces, the third surface facing directly towards the second surface;
second bond wires coupled between the fourth surface and the second conductors; and a molding structure covering at least respective portions of the substrate, the first and second bond wires, and the first and second semiconductor dies, in which the molding structure includes:
- a cavity around at least portions of the first and second semiconductor dies, the cavity including a space between the first surface and the substrate; and
- an opening extending through the molding structure and connecting directly with the cavity.

2. The integrated circuit of claim 1, wherein the first semiconductor die includes first bond pads on the second surface, and the second semiconductor die includes second bond pads on the fourth surface; and
wherein the first bond wires are coupled between the first bond pads and the first conductors, and the second bond wires are coupled between the second bond pads and the second conductors.

3. The integrated circuit of claim 1, further comprising a film layer on the molding structure and covering at least a portion of the cavity.

4. The integrated circuit of claim 3, wherein the film layer includes a screen-printed film.

5. The integrated circuit of claim 3, wherein the film layer covers the opening.

6. The integrated circuit of claim 1, wherein:
the molding structure includes opposite fifth and sixth surfaces;
the fifth surface abuts the substrate; and
the opening extends between the sixth surface and the cavity.

7. The integrated circuit of claim 1, further comprising a die attach layer between the second and third surfaces, in which the die attach layer faces towards each of the second and third surfaces.

8. An integrated circuit, comprising:
a substrate including conductors;
a semiconductor die having opposite first and second surfaces, the first surface spaced apart from and opposing the substrate;
bond wires coupled between the second surface and the conductors; and
a structure including a molding compound covering at least respective portions of the substrate, the semiconductor die, and the bond wires, in which the structure includes:
- a cavity around at least a portion of the semiconductor die, at least first portions of the bond wires are exposed in the cavity and at least second portions of the bond wires are in the molding compound, the cavity including a space between the first surface and the substrate; and
- an opening extending through the structure to the cavity.

9. The integrated circuit of claim 8, further comprising a film layer on the structure and covering at least a portion of the cavity.

10. The integrated circuit of claim 9, wherein the film layer includes a screen-printed film.

11. The integrated circuit of claim 9, wherein the film layer covers the opening.

12. The integrated circuit of claim 8, wherein:
the structure includes opposite third and fourth surfaces;
the third surface abuts the substrate; and
the opening extends between the fourth surface and the cavity.

13. The integrated circuit of claim 8, further comprising a die attach layer between the first surface and the substrate.

14. The integrated circuit of claim 8, wherein the substrate includes a die paddle, and the space is between the first surface and the die paddle; and
wherein the die paddle has a third surface facing away from the first surface, and at least a portion of the third surface is exposed by the structure.

15. The integrated circuit of claim 8, further comprising a lead frame, and the substrate is part of the lead frame.

16. The integrated circuit of claim 8, wherein the semiconductor die includes bond pads on the second surface, and the bond wires are coupled between the bond pads and the conductors.

17. The integrated circuit of claim 13, wherein the die attach layer includes a nonconductive material.

18. The integrated circuit of claim 8, wherein the opening faces the second surface.

19. The integrated circuit of claim 1, wherein the opening faces the fourth surface.

20. The integrated circuit of claim 7, wherein the die attach layer includes a nonconductive material.

21. The integrated circuit of claim 1, wherein the substrate includes a die paddle.

22. The integrated circuit of claim 1, further comprising a lead frame, and the substrate is part of the lead frame.

23. The integrated circuit of claim 7, wherein the die attach material is attached to both the second and third surfaces.

24. An integrated circuit comprising:
a substrate including first conductors and second conductors;
a first semiconductor die having opposite first and second surfaces, the first surface facing directly towards and spaced apart from the substrate;
first bond wires coupled to between the first semiconductor die and the first conductors;
a second semiconductor die on the first semiconductor die, in which the first semiconductor die is between the substrate and the second semiconductor die, and the second surface faces directly towards the second semiconductor die;
second bond wires coupled between the second semiconductor die and the second conductors; and
a molding structure covering at least respective portions of the substrate, the first and second bond wires, and the first and second semiconductor dies, in which the molding structure includes:
- a cavity around at least portions of the first and second semiconductor dies, the cavity including a space between the first surface of the first semiconductor die and the substrate; and
- an opening extending through the molding structure connects directly with the cavity.

25. The integrated circuit of claim 24, wherein the opening faces towards the second semiconductor die.

26. The integrated circuit of claim 1, wherein portions of at least one of the first or second bond wires are exposed in the cavity.

27. The integrated circuit of claim 24, wherein portions of at least one of the first or second bond wires are exposed in the cavity.

* * * * *